United States Patent [19]

Begley et al.

US005773151A

[11] Patent Number: 5,773,151

[45] Date of Patent: Jun. 30, 1998

[54] SEMI-INSULATING WAFER

[75] Inventors: Patrick A. Begley, West Melbourne; Anthony Rivoli, Palm Bay; Gyorgy Bajor, Melbourne; Rex E. Lowther, Palm Bay, all of Fla.

[73] Assignee: Harris Corporation, Melbourne, Fla.

[21] Appl. No.: 497,404

[22] Filed: Jun. 30, 1995

[51] Int. Cl.$^6$ ..................................................... B32B 9/04
[52] U.S. Cl. .................... 428/446; 428/448; 428/469; 428/689; 428/697; 428/699; 428/700; 428/701; 428/702
[58] Field of Search ................................... 428/446, 448, 428/689, 697, 698, 699, 700, 701, 702, 469; 437/51, 189, 190, 193

[56] References Cited

U.S. PATENT DOCUMENTS

| | | | |
|---|---|---|---|
| 4,538,167 | 8/1985 | Yoshino et al. | 357/59 |
| 4,819,037 | 4/1989 | Sakakibara et al. | 357/4 |
| 4,851,257 | 7/1989 | Young | 427/96 |
| 4,903,108 | 2/1990 | Young | 357/49 |
| 4,914,501 | 4/1990 | Rivoli | 357/68 |
| 4,984,052 | 1/1991 | Koshino et al. | 357/49 |
| 5,206,523 | 4/1993 | Goesele et al. | 257/16 |
| 5,266,135 | 11/1993 | Short | 156/87 |
| 5,334,273 | 8/1994 | Short | 156/87 |
| 5,422,299 | 6/1995 | Neudeck et al. | 437/63 |

FOREIGN PATENT DOCUMENTS 0 573 921 A3  12/1993  European Pat. Off. .

OTHER PUBLICATIONS

S. A. Campbell, "The Possibility of Semi–Insulating Silicon Wafers", 1995 IEEE MTT–S International Microwave Symposium Workshop WFFA Silicon RF Technology, pp. 1–7, May 1995.

M. H. Hanes, et al. "MICROX™–An All Silicon Technology For Monolithic Microwave Integrated Circuits", *IEEE Electron Device Letters*, vol. 14, No. 5, pp. 219–221, May 1993.

E. H. Nicollian and J. R. Brews, "MOS (Metal Oxide Semiconductor) Physics and Technology", John Wiley & Sons, New York, (1982), pp. 749–750.

K. Anzai, F. Otoi, M. Ohnishi, and H. Kitabayashi, "Fabrication Of High Speed 1 micron FIPOS/CMOS", Electronics Devices Group Oki Electric Industry Co. Ltd., Japan, (1984), pp. 796–799.

H. Takai and T. Itch, "Porous Silicon Layers And Its Oxide For The Silicon–On–Insulator Structure", J. Appl. Phys. vol. 60, No. 1., (Jul. 1, 1986), pp. 222–225.

"Polysilicone Layer With Oxygen Improves Devices", Electronics International, vol. 48, No. 13, Jun. 26, 1975, pp. 5E–6E, XP002013570.

*Primary Examiner*—Timothy Speer
*Attorney, Agent, or Firm*—Jaeckle Fleischmann & Mugel, LLP

[57] ABSTRACT

A bonded wafer 10 has a silicon device layer 20 bonded to a layer of semi-insulating material 14, preferably a mobility degraded silicon such as polycrystaline silicon. Layer 14 is thick enough and substrate 16 is conductive enough to reduce resistive losses when devices in layer 20 are operated at frequencies above 0.1 Ghz. Substrate 16 is conductive enough and semi-insulating material 14 is resistive enough to prevent cross-talk among devices in layer 20.

24 Claims, 9 Drawing Sheets

SEMI-INSULATING WAFER

SUMMARY

Integrated circuits that operate at microwave frequencies are implemented on substrates comprising monocrystalline gallium arsenide or by using hybrid circuit techniques. Attempts to implement microwave frequency integrated circuits with conventional silicon technology has been limited due to high losses occurring in the silicon substrate at gigahertz frequencies. Gallium arsenide and hybrid circuit technologies are effective in producing integrated circuits operating at microwave frequencies, but still have several drawbacks. Both technologies are expensive and generally produce circuits of low device density compared to the cost and density of devices in planar silicon integrated circuits. Highly resistive float zone method substrates are now being applied to this multi-gigahertz area however these types of substrates are very expensive and limited in wafer diameter to 100 mm. Accordingly, it would be desirable to apply both the cost benefits and density advantages of conventional silicon-based technology to obtain integrated circuits operating in multigigahertz ranges. This has been prevented, in part, by the use of traditional insulators such as silicon dioxide. Silicon dioxide, while an excellent insulator, has relatively low thermal conductivity. It is desirable to have a substrate with the following characteristics: (1) high quality device silicon region for high complexity, high performance circuit elements, (2) good thermal conductivity, (3) good electrical isolation between devices and to the substrate, (4) low resistive loss characteristics, (5) low cross-talk characteristics and (6) unlimited wafer diameter. This invention provides a substrate structure which is capable of all the desirable characteristics through the following: (1) high quality device silicon through the bonded wafer SOI technique, (2) good thermal conductivity due to the silicon based substrate, (3) good electrical isolation through the bonded wafer SOI technique, (4) low RF loss characteristics through the use of a semi-insulating layer under the devices, (5) low cross-talk through the use of a conductive region under the semi-insulating region and (6) unlimited wafer diameter since standard silicon wafers form the starting substrate.

This invention has superior characteristics compared to prior art gallium arsenide in the areas of cross-talk, substrate cost, wafer diameter and circuit complexity. This invention has superior characteristics compared to prior art standard silicon substrates in the areas of R.F. resistive losses and cross talk. Compared to prior art, high resistivity float zone silicon substrates, the invention has superior cross-talk characteristics, lower cost and larger diameter wafer availability.

The invention provides a bonded wafer with a semi-insulating layer and conductive underlying structure that reduces substrate losses as well as cross-talk at high frequencies including multi-gigahertz frequencies. The bonded wafer has a handle substrate preferably of monocrystalline silicon. A semi-insulating layer is disposed over the handle substrate. The semi-insulating layer is preferably silicon in the form of polycrystalline silicon, amorphous silicon, or other forms of silicon including oxygen-doped silicon and porous silicon. The semi-insulating layer of silicon has a relatively high thermal conductivity. Other semi-insulating materials could be used, including but not limited to diamond. The semi-insulating layer is followed by an insulating, silicon dioxide layer which is then bonded to a device layer comprising monocrystalline silicon. The integrated circuits including MOSFET transistors and bipolar transistors are formed in the device layer of monocrystalline silicon in the manner well known to those skilled in the art.

The semi-insulating layer when combined with an underlying conductive layer results in both reduced substrate losses and reduced cross-talk between circuit elements. In the preferred embodiment, the semi-insulating layer is as thick as or less than the device widths in the device layer. In addition, the semi-insulating layer is made as resistive as practical and the substrate is made as conductive as practical. A barrier layer between the semi-insulating layer and the substrate may be necessary. The barrier layer is a layer of epitaxial undoped silicon, or metal or silicide and may be multiple layers of these materials to further enhance the R.F. performance of the resulting structure. The barrier layer prevents dopants in the handle substrate from migrating into the semi-insulating layer of the silicon thus retaining its semi-insulating characteristics..

DRAWINGS

DETAILED DESCRIPTION

Figure 1:
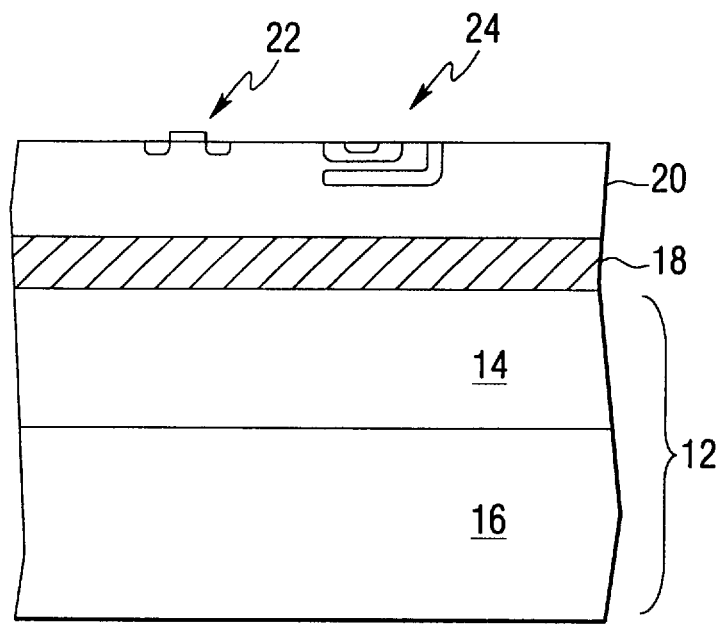
FIG. 1 is a cross-section of bonded wafer including the invention.

FIG. 1 shows a bonded wafer 10 made in accordance with the invention that dramatically reduces substrate losses while retaining good heat conduction from active devices 22, 24 in the device layer 20. The bonded wafer 10 has a handle substrate 16 preferably made of monocrystalline silicon. Deposited on the handle wafer 16 is a layer 14 of semi-insulating material. The semi-insulating material may be polycrystaline silicon, amorphous silicon, semi-insulating polysilicon (SIPOS) or a fully insulating silicon using FIPOS. The semi-insulating material of layer 14 may be any mobility degraded crystalline silicon or other suitable electrical insulator with high thermal conductivity, such as diamond. The semi-insulating layer 14 is bonded to an insulating layer 18 which is disposed on device layer 20. Insulating layer 18 is typically an oxide. The bond may be formed in accordance with the process shown in U.S. Pat. Nos. 5,266,135 and 5,334,273 assigned to Harris Corporation. Device layer 20 includes a plurality of semiconductor devices including diodes and transistors that are integrated into circuits. A representative field effect transistor 22 and a bipolar transistor 24 are shown in FIG. 1.

In the embodiment shown in FIG. 1, the handle wafer 16 is approximately 600 microns thick and has a resistivity between 10–20 ohm-cm. The semi-insulating layer 14 of polysilicon is approximately 50 microns thick. Isolation oxide layer 18 is approximately 2 microns thick and device silicon layer 20 is approximately 10 microns thick. The silicon layer 20 containing an insulating layer 18, is bonded to the handle wafer 12, silicon layer 20 may be substantially thicker than 10 microns, for example, 500–700 microns. After bonding the device wafer 20 is thinned using various techniques including etching, lapping or polishing.

In operation at high frequencies of multiple gigahertz, bonded wafer 10 experiences substantially less loss than what a standard silicon device wafer or a standard bonded wafer would experience. The semi-insulating layer 14 is more thermally conductive than silicon dioxide. The substrate layer 16 is conductive enough to reduce cross-talk between devices 22, 24.

Figure 2:
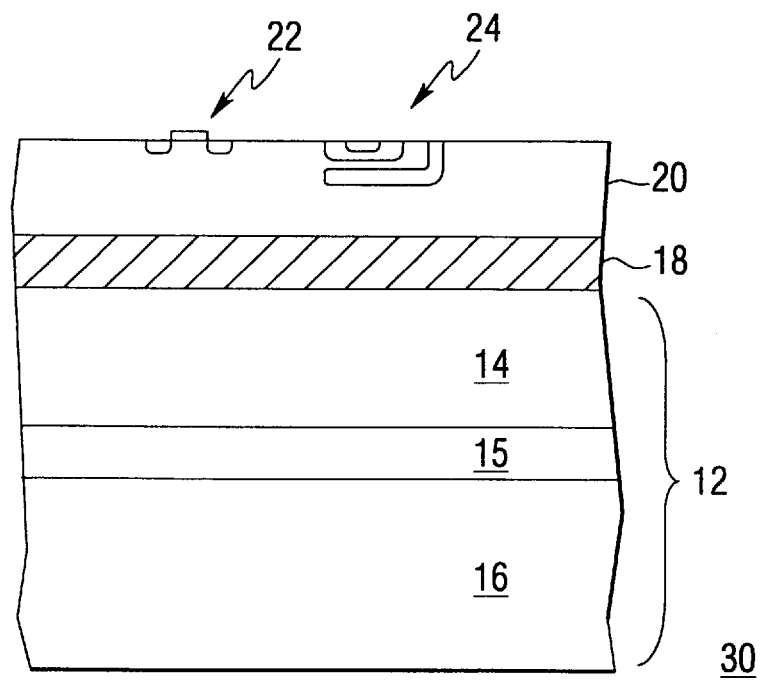
FIG. 2 is a cross-section of an alternate embodiment of the invention.

Turning to FIG. 2, there is shown a second embodiment of the invention where like reference numerals identify like elements. The bonded wafer 30 has a barrier layer 15 disposed between the substrate 16 and the semi-insulating layer 14. The barrier layer 30 is approximately 1.5 microns thick and comprises an epitaxial layer of undoped silicon. The barrier layer 15 is grown on the monocrystalline substrate 16 in an epitaxial reactor which is well known in the art. Handle wafer 16 is very highly doped in order to reduce cross-talk between devices 22, 24. Handle wafer 16 is approximately 600 microns thick. Semi-insulating layer 30 has a thickness of approximately 30 microns. The insulating layer 18 and the device layer 20 have the same thicknesses as shown in FIG. 1. The semi-insulating layer 14 of FIG. 2 is reduced in thickness in order to bring the highly conductive handle substrate layer 16 closer to devices 22, 24. By effectively moving the highly conductive substrate 16 closer to devices 22, 24, cross-talk between the devices 22, 24 is reduced. However, substrate loss may be slightly increased.

This invention provides a mechanism which allows the optimization of substrate losses and device cross-talk characteristics which are not possible in prior art devices. One of the features of the invention is our discovery that the thickness of the semi-insulating layer 14 can be used to balance gains in reduced resistive losses with gains in reduced cross-talk. So, as the layer 14 is reduced in thickness, resistive losses tend to increase while cross-talk is reduced due to the shielding effect of highly conductive layer 16. As the highly conductive layer 16 is moved closer to devices 22, 24, cross-talk is reduced. Too thick a layer 14 will result in increased cross-talk, while too thin a layer 14 will result in high resistive losses. The layer 14 is made thick enough and the layer 16 is made conductive enough in order to strike a balance between reducing resistive losses and reducing cross-talk. This balance is generally struck for the particular operating frequency of the devices 22, 24.

In order to understand how the proper balance can be made, reference is made to FIGS. 3–12 in connection with the following description. We have discovered that minimization of substrate parasitics including cross-talk and resistive substrate losses can be a very complex issue. The amount of current induced in the substrate, for example, will depend heavily on metal line placement. The following analysis will focus on the main factors affecting losses in order to determine a fair estimate of their magnitudes. This will provide a set of guidelines for optimizing the substrate doping profile and the substrate depth. The following description also provides a worst-case estimate for substrate resistive losses in the simple case of a very long, straight metal line. To determine an estimate for and an understanding of cross-talk, capacitances are calculated for a representative case of three adjacent devices (D1, D2, D3) using a two-dimensional finite difference device simulator.

Substrate Resistive Losses

Figure 3:
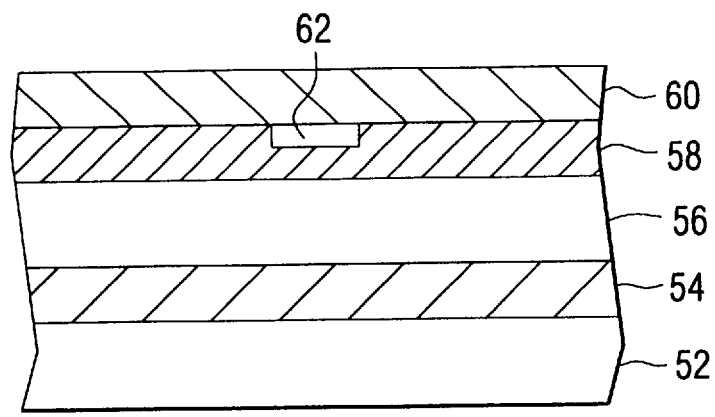
FIG. 3 is a cross-section of an analytical model used for simulating the invention.
Figure 4:
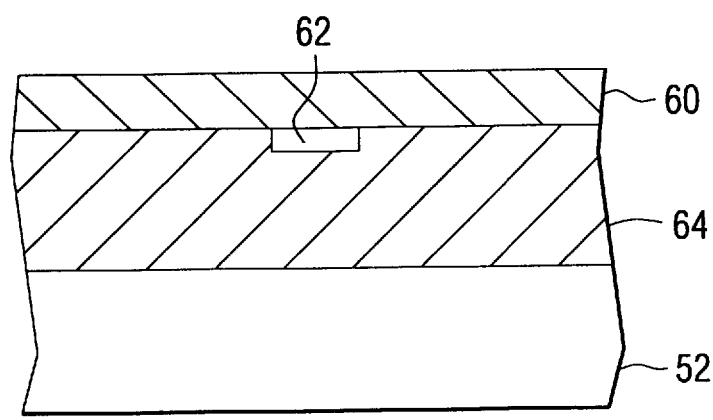
FIG. 4 is a further cross-section of a simplified analytical model.

Consider FIG. 3 where a very long, straight metal conductor 62 runs over various layers of bonded wafer 50. Bonded wafer 50 has a handle substrate 52 typically of monocrystalline silicon. A bond oxide layer 54 couples the substrate 52 to a device wafer 56. The device wafer 56 includes a number of devices (not shown) that are connected by metal lines. Line 62 is representative of a cross section of one metal line passing between two or more devices. Metal line 62 is electrically isolated from the devices in layer 56 by an oxide layer 58. Metal line 62 is also covered by another insulating layer 60 that may be an oxide or nitride layer.

In nearly all practical cases, conduction in the device layer 56 for these long distances can be ignored because it is thin compared with its skin depth with most typical doping levels and because areas of high doping are confined to isolated areas too small to allow significant conduction. This allows for a simplification of the geometry of wafer 50 to that shown in FIG. 4. There, the wafer 50' comprises a substrate 52 and a semi-insulating layer 64. Layer 64 is "semi-insulating" enough even though it includes device layer 56 which is silicon.

Assume the resistivity at layer 52 is low enough that the skin depth is much less than the substrate thickness. For distances more than a few skin depths below the substrate-insulator interface, it is known that both the electric and magnetic fields due to AC current are essentially zero. Therefore the sum effect of the induced electric fields is to generate current such that it is equal in direction and magnitude, and opposite in phase to the AC current in the conductor 62. This is simply return current in a ground plane. At microwave frequencies, as will be shown, these induced resistive losses can be greater than those in the metal conductors 62.

One may derive a rough, quick estimate for induced substrate resistance. For the wafer 52' of FIG. 4 assume that the entire structure is conformed into cylindrical symmetry about an axis centered on the metal conductor 62. An attempt to justify this approximation will be made later. The solution of Maxwell's equations for the electric field then becomes:

$$\nabla^2 E - j\omega\mu E/\rho = 0 \quad \text{(Eq.1)}$$

$$\frac{1}{r}\frac{d}{dr}\left[r\frac{dE_z}{dr}\right] - 2jE_z/\delta^2 = 0 \quad \text{(Eq.2)}$$

where E is the skin depth and $j=-1^{-1}$ $$\delta = \left(2\frac{\rho}{\mu\omega}\right)^{1/2}, \quad \text{(Eq.3)}$$

Figure 5:
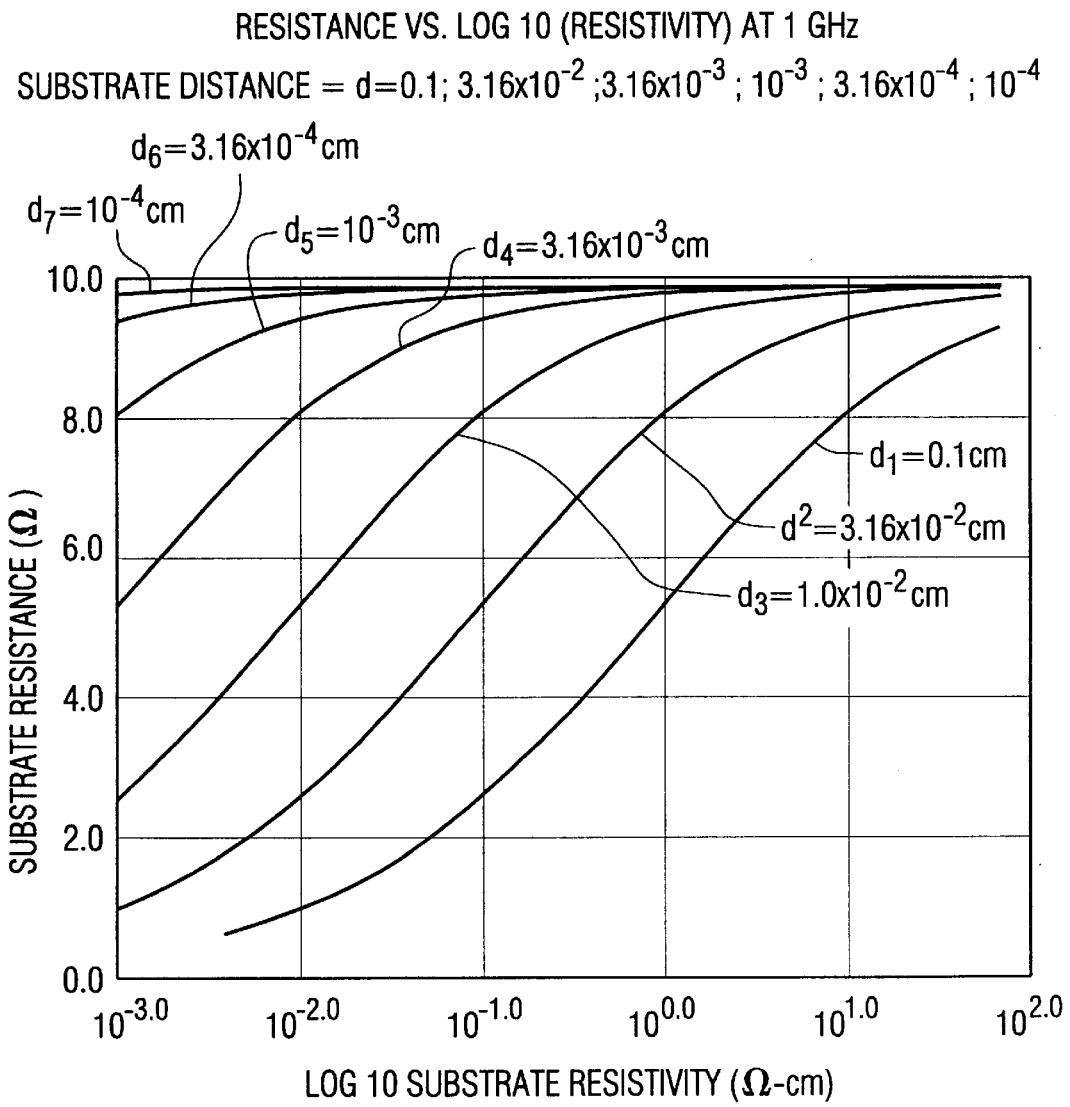
FIG. 5 is a graph showing the resistance vs. Log 10 (resistivity) at a frequency $10^9$ Hertz for different substrate dopant levels.
Figure 6:
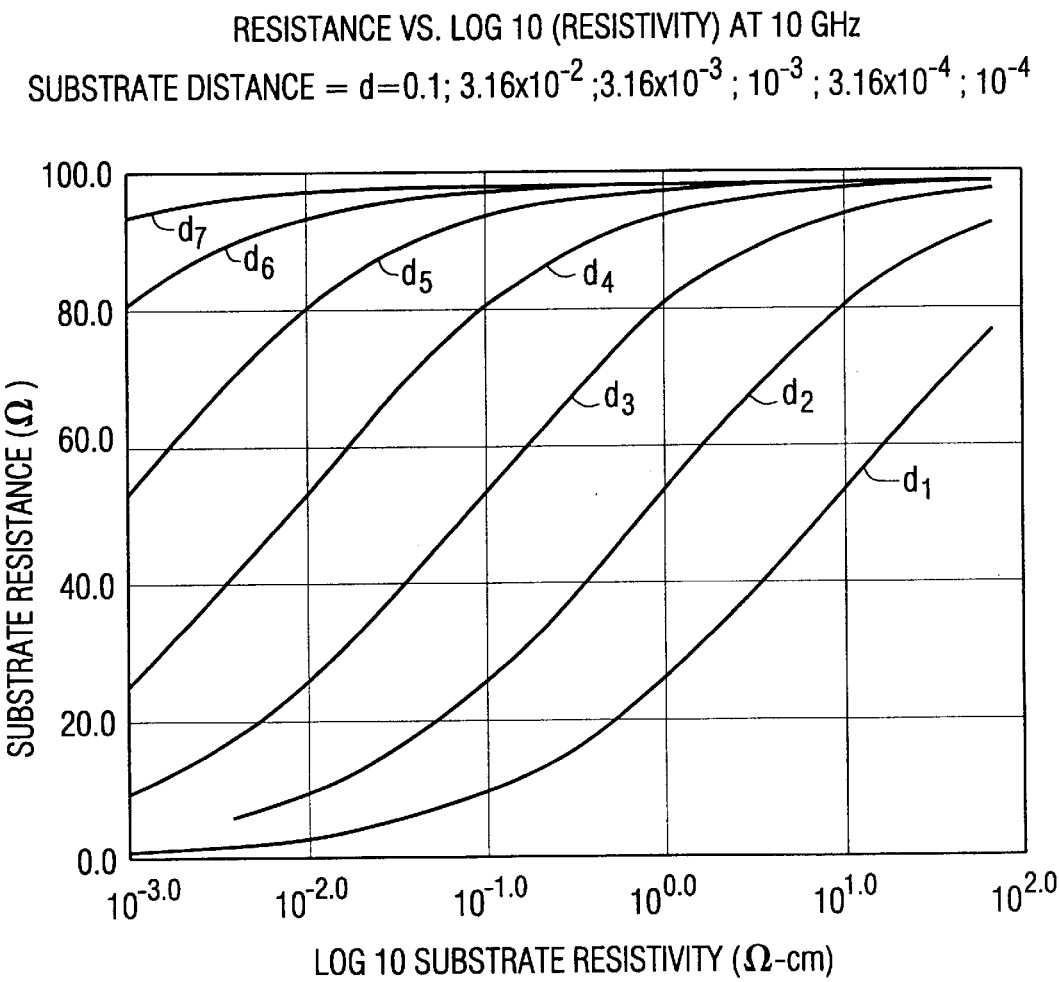
FIG. 6 is a graph similar to FIG. 5 for frequencies at $10^{10}$ Hertz.
Figure 7:
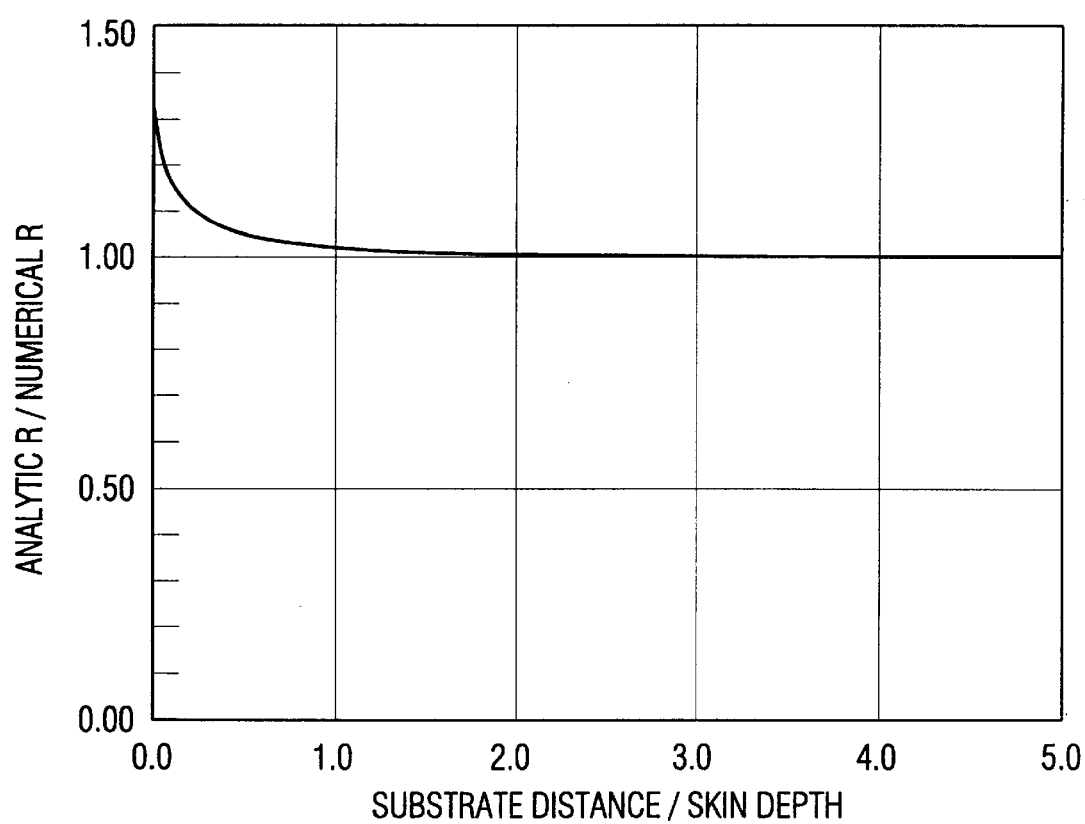
FIG. 7 is a graph showing the accuracy of an analytical simplification.

$E_z$ is the component of the electric field E in the axial direction, $\omega$ is the angular frequency, $\mu$ is the magnetic permeability, $\rho$ is the resistivity of the substrate, and r is the distance to the center of the metal line. The solutions to Eq. 2 are Bessel functions of complex arguments. The correct combination of these Bessel functions was determined by applying the boundary conditions that the electric and transient magnetic fields are zero at large r. The latter was done by forcing the integrated electric field (or current density) to be equal in magnitude and opposite in phase to the current in the metal line. From this solution, the integral of $EE^*/\rho$ was performed to get the resistive power loss in the substrate. Since the current is fixed for low resistivities, this power loss is proportional to the substrate resistance. In fact, the substrate resistance, R, can be defined by this relationship. Some results showing substrate resistance vs. substrate resistivity are shown in FIG. 5 (frequency $=10^9$ Hz) and FIG. 6. (frequency $=10^{10}$ Hz). More enlightening, however, is the comparison of these numerical results to a simple analytic formula. This formula simply takes the resistivity and divides it by an area determined by the skin depth as follows:

$$R_{analytic} = \frac{\rho l}{\pi(d+\delta)^2 - \pi d^2} - \frac{\rho l}{\pi\left[d + \left(2\frac{\rho}{\mu\omega}\right)\right]^2 - \pi d^2} \quad \text{(Eq.4)}$$

where l is the length of the metal line and d is the distance from the metal line to the top interface of the substrate. The denominator in (4) is the area of a $\delta$-wide strip at the top of the substrate. The result of this formula, compared to the exact result in FIG. 7, tends to overestimate R, but never by more that a factor of 1.27. As expected, this formula approaches the numerical result when the substrate distance is large compared to the skin depth, and the physics becomes more locally planar. From Eq. 4, it is shown that, for $d<<\delta$, R is proportional to the frequency and independent of the resistivity. At $d >> \delta$ the more familiar relationship is obtained, i.e., that R is proportional to the square root of both frequency and resistivity.

Qualitatively, all these effects will still be present for the actual, planar geometry. The main difference is that the available area for conduction will be decreased. A rough guess is that this increases R by a factor of 3. Those skilled in the art will understand that a full numerical solutions of Maxwell's equations may yield a more accurate formula similar to equation 4, for modeling the planar geometries.

Using Eq. 4 to minimize R, it is desirable to make d large with respect to $\delta$ and to make the resistivity of the substrate 52 as low as possible. Typically this has not been done because the substrate distances range around 10 $\mu$ms or less. At very high frequencies, where this particular parasitic is the dominating consideration, the substrate is often made so highly resistive that the skin depth is large compared to the substrate thickness; and essentially no current flows in the substrate. In this case the silicon 56 can be considered as the insulator, and the distance to the substrate, d, can be replaced by the distance to the metal upon which the silicon sits. Often, however, there are other important parasitics to consider.

Cross-Talk

Figure 8:
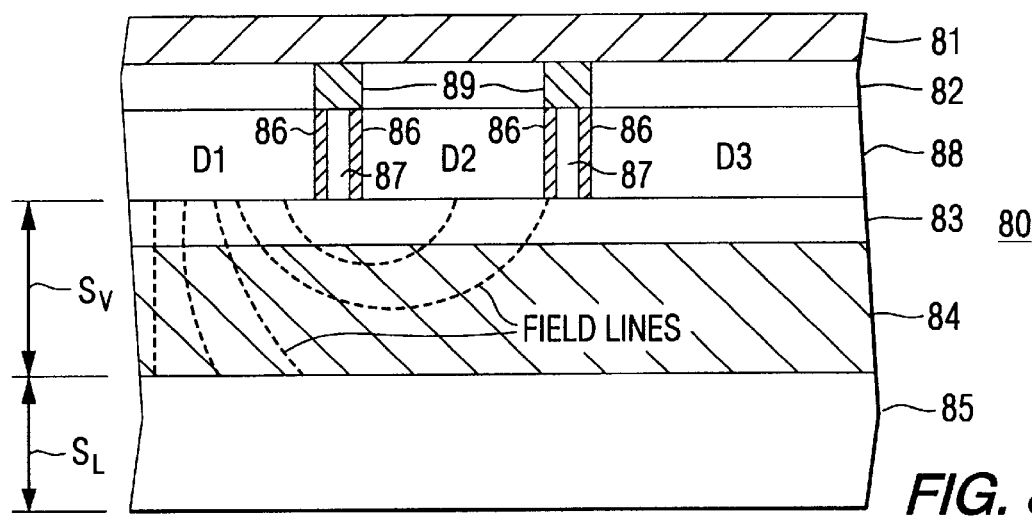
FIG. 8 is a cross-section of a bonded wafer having three devices.

Substrates also act as parasitic capacitors coupling nearby devices. With reference to FIG. 8, there is shown a structure 80 containing 3 devices D1, D2, D3 with respective total lengths of 46 microns, 46 microns and 280 microns. The structure 80 has a handle substrate 85. Above the handle substrate 85 is a semi-insulating layer 84. Semi-insulating layer 84 is typically polysilicon. A bond layer 83 bonds the semi-insulating layer 84 to the device wafer 88. Idealized single metal contacts 82, separated by oxide, are added to contact each device. The devices are isolated from each other laterally by trenches having oxidized side walls 86 that are filled with suitable material 87, such as polysilicon. Covering the metal layer 82 is an oxide layer 81.

Figure 9:
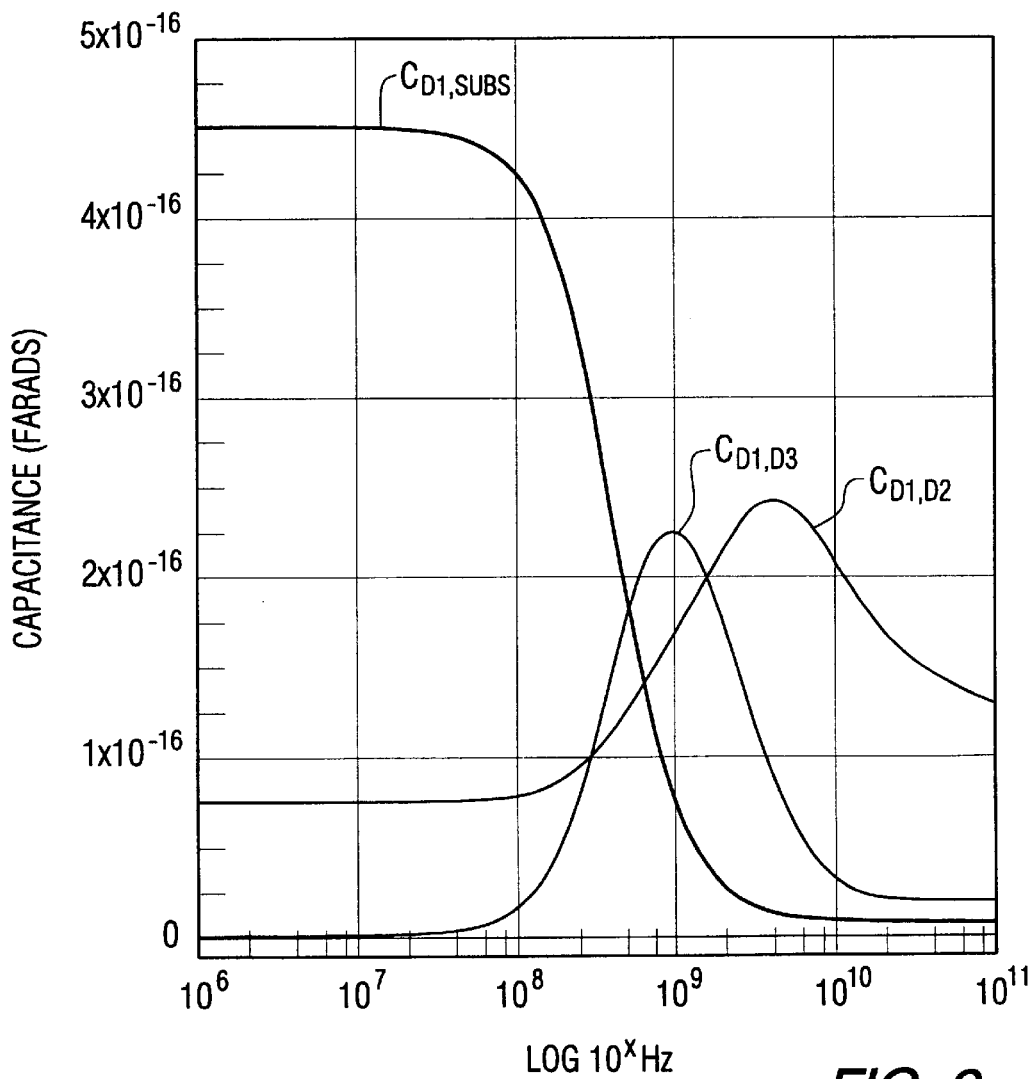
FIG. 9 is a graph showing the capacitance between different elements of the bonded wafer of FIG. 8 as a function of frequency.

Results from numerical device simulation are shown in FIG. 9 by plotting elements from the capacitance matrix $\{C_{D1,D2} + C_{D1,D3} + C_{D1,Sub}\}$ against frequency. The substrate doping in this case is $10_{15}$ cm$^3$. Most of the field lines initiated in D1 will be terminated at the top of the substrate below, while most of the rest will travel directly to D2. At low frequencies, all of this substrate charge can be supplied by the substrate contact because the RC constant is small compared with the charging time. But as the frequency increases, this path gets frozen out as the charging time becomes small with respect to RC. As this happens the less resistive couplings from nearby devices now compete to supply this charge. At the intermediate frequency of $10^9$ Hz, the capacitive coupling $C_{D1,D3}$ is actually greater than $C_{D1,D2}$ because D3—meant to represent a collection of nearby devices—has a much larger surface exposed to the substrate than D2. As the frequency is increased further, however, $C_{D1,D3}$ drops almost to zero while $C_{D1,D2}$ dominates because it has a much lower path resistance.

Figure 10:
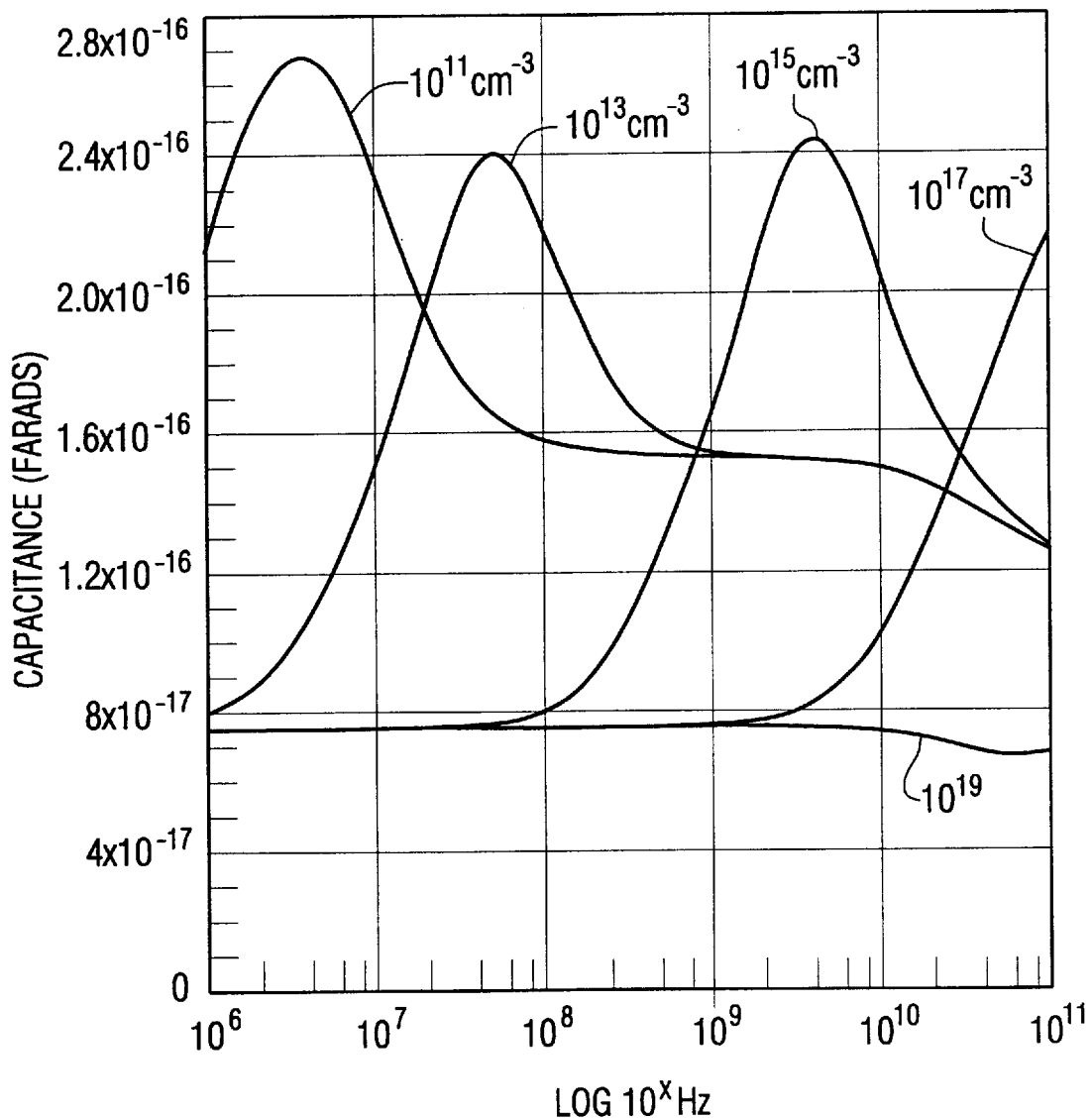
FIG. 10 is a graph showing the capacitance between devices D1 and D2 as a function of frequency for different levels of substrate doping in the prior art of conventional silicon substrates.
Figure 11:
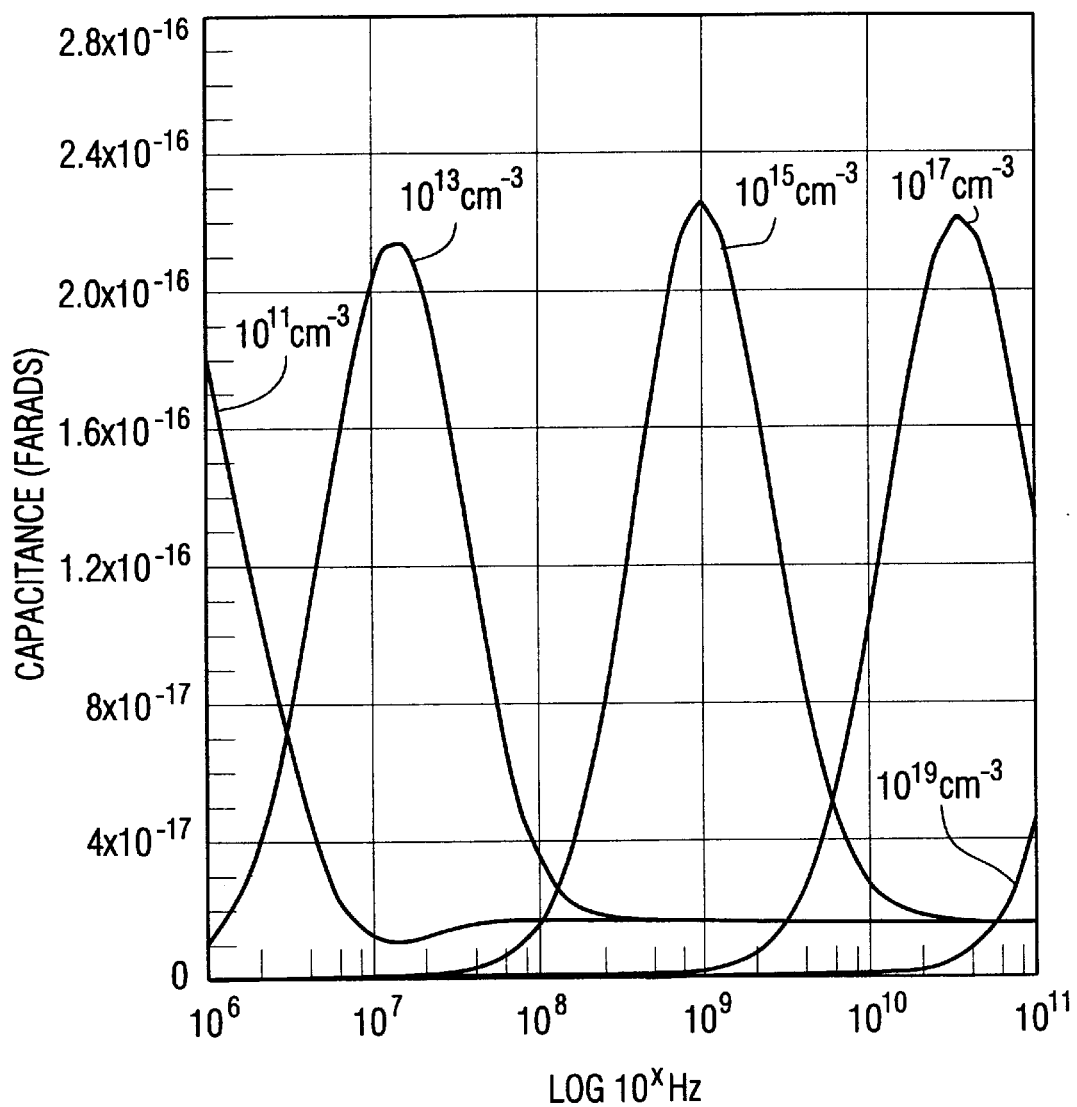
FIG. 11 shows the capacitance between devices D1 and D3 as a function of frequency for different levels of substrate doping in the prior art of conventional silicon substrates.

FIGS. 9 and 10 show $C_{D1,D2}$ and $C_{D1,D3}$, respectively, each over a range of uniform substrate dopings $\{10^{11}, 10^{11}, 10^{15}, 10^{17}, 10^{19}\}$cm$^{-3}$. In general, the trends are the same, but shifted toward the higher frequencies for the more highly-doped substrates. At low frequencies, $C_{D1,D2}$ is dominated by the direct dielectric capacitance from fields above the substrate. At higher frequencies—in the peaks of FIG. 9 (as the substrate coupling gets frozen out)—the additional conductive path below the oxide allows additional coupling between D1 and D2. At even higher frequencies, this conductive path also freezes out—leaving in its place the dielectric coupling, including fringing through the substrate that was shielded at low frequencies. From FIG. 9, it is apparent that these same effects are present for second nearest neighbors but are much different in magnitude. At frequencies above and below the peak, $C_{D1,D3}$ drops nearly to zero.

Dual-Resistivity Substrate

The above analysis is now repeated for the same devices, but with a substrate that is divided into two sections. The upper section of the substrate, $S_U$, has a higher resistivity than the lower section, $S_L$. In this example, $S_U$ is 30$\mu$ms thick and is doped at $\{10^{11}, 10^{13}, 10^{15}, 10^{17}\}$cm$^{-3}$ while $S_L$ is generally doped as high as possible—$10^{20}$ cm$^{-3}$ in this example.

A note of caution is in order here. Since device simulators do not simulate all of Maxwell's equations, the skin effect on the substrate resistance is not automatically taken into account. This skin effect is very large when the skin depth is much less than the substrate thickness. To account for this, the $S_L$ doping was scaled such that its overall resistance, for each frequency, is about the same as if the skin effect were included. At 10 GHz, the doping used to simulate $10^{20}$ cm$^{-3}$ was actually $10^{18}$ cm$^{-3}$. As it turns out, this change made a significant difference in these curves only for the upper substrate doping case of $10^{17}$ cm$^{-3}$ (or higher) and only at frequencies greater than $10^{10}$ Hz.

Figure 12:
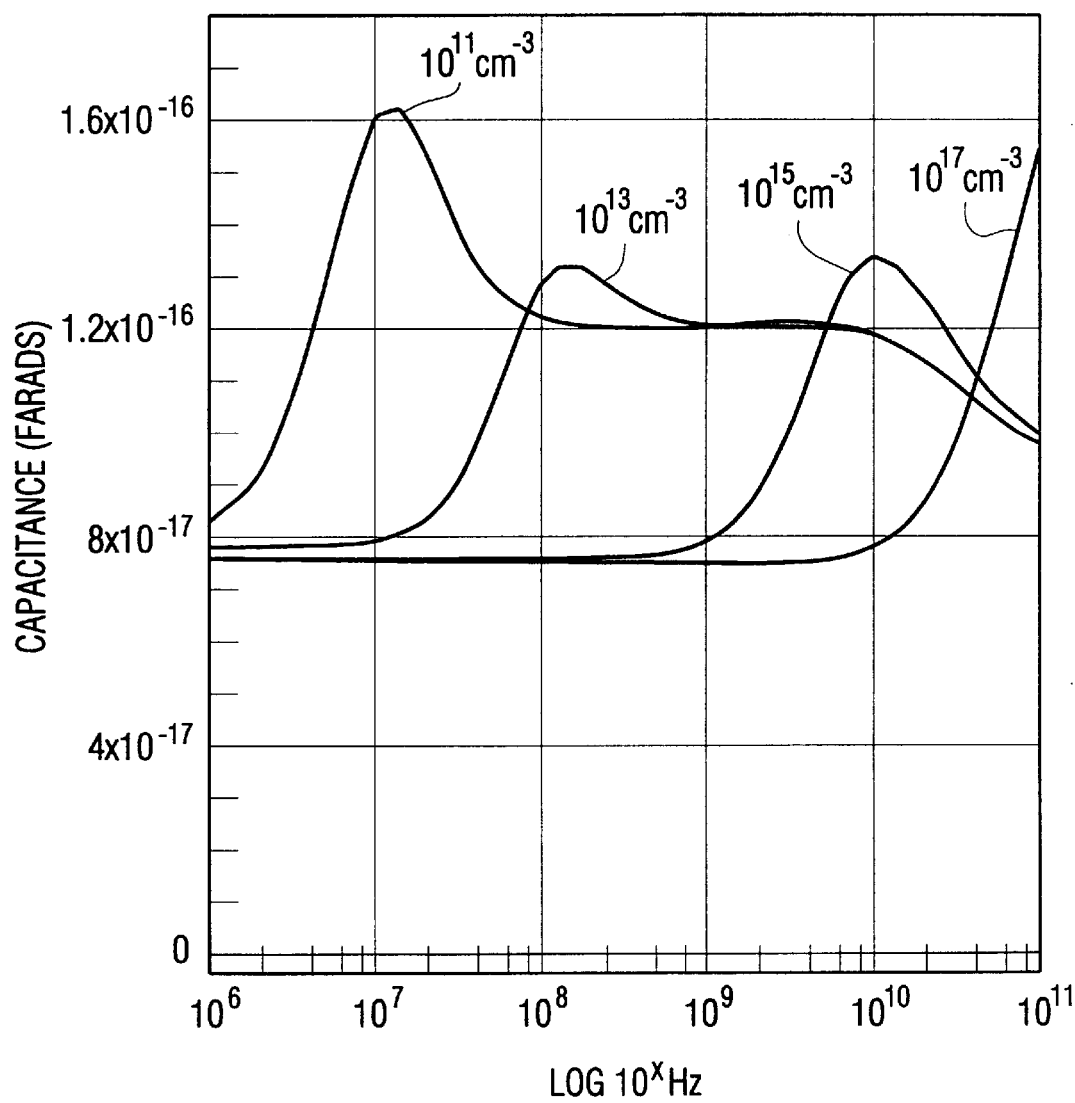
FIG. 12 shows the altered capacitances between devices D1 and D2 and devices D1 and D3 for a multi-layer substrate made in accordance with the invention.

FIG. 12 shows both $C_{D1,D2}$ and $C_{D1,D3}$ for these dual substrate devices. The peak of $C_{D1,D3}$ is reduced by better than a factor of 10. For a physical understanding of this, consider the path of the AC current from D1 to D2 to be divided into two parts: Path 1 is defined as entirely through the upper, more highly resistive part of the substrate $S_U$; while Path 2 is down through $S_U$ from D1, laterally through $S_L$, and finally up through $S_U$ to D2. As before, at low frequencies, $C_{D1,Subs}$ dominates and shields any substrate coupling between devices. But as the frequency is increased, resistive substrate current freezes out due to resistance in the upper part of the substrate (leaving only displacement current in this region). During this transition, however, resistive current through Path 2 has already begun to freeze out because it has a resistance approximately double that for current from the substrate (which only passes through $S_U$ once). Similarly, since the thickness of $S_U$ was chosen to be about the same or less than the device widths, resistance through Path 1 is also greater than resistance to the substrate by at least the same amount. At frequencies higher than this transition, AC current through the upper substrate between neighboring devices is primarily displacement current. Note, however, that cross-talk from displacement current is also reduced by the dual substrate. Displacement current through Path 1 must still compete with charge supplied by the substrate. More importantly, any displacement current to or from $S_L$ (as in Path 2) will be intercepted by the highly-doped region $S_L$ which is still controlled by the substrate electrode.

A Design Example

Assume a circuit runs at 10 GHz. The substrate resistances chosen to be half or less that of the widest metal lines used in the layout (10 $\mu$ms wide and 1.5 $\mu$ms thick in this example, or about 30 $\Omega$/cm). Assuming the resistivity of $S_U$ is high enough such that its skin depth is very high with respect to its thickness, then d in Eq. 4 is the distance between the metal line and the $S_{L/SL}$ interface. Including the fudge factor of 3, using d=40 $\mu$m (corresponding to the thickness of 30 for $S_U$ in the above example), and assuming a resistivity of 2E-4 $\Omega$-cm (a doping of 5E20 cm$^{-3}$) for $S_L$, the total substrate resistance comes to about 9$\Omega$. This is safely under the goal, even when considering the approximations involved. In addition to the tolerably low substrate losses, the cross-talk advantages of the dual-resistivity substrate are as described in the previous section. The $S_U$ doping can now be chosen for the optimum capacitance profiles. From FIG. 12, any value from $10^{15}$ cm$^{-3}$ or below should be acceptable.

To go to higher frequencies, the $S_U$ thickness would have to be increased to make the substrate resistance low enough; and this would sacrifice some of the shielding effect of the substrate. More exotic solutions might be to embed a highly conductive layer such as a silicide to the top of $S_L$, or to simply replace $S_L$ with metal.

Physically-based estimates of substrate resistance and cross-talk can be used as guidelines for optimizing substrate properties for the minimization and trade-off of these parasitics. A dual-resistivity substrate is used as an example and it is shown that they have certain advantages over highly-resistive substrates. FIG. 9 shows that even the most highly resistive of the substrates still allows significant cross-talk at 1 MHz; and for most circuits that have components at 10 GHz, there are often other parts of the circuit running at lower frequencies where cross-talk can be important. The actual resistivity of highly resistive substrates can also be very sensitive to applied DC biases. Without dielectric isolation, carrier injection would destroy any high resistivity; with isolation, accumulation or inversion layers can be created at the insulators/substrate boundary. In the above example, a DC bias of 2 V applied to the devices creates an accumulation layer that raises the peak of $C_{D1,D3}$ by 50% and broadens the width of the peak from 22 db to 47 db. This same bias applied to the dual-resistivity substrate of the last example had no effect because the additional conduction allowed by the accumulation layer was dwarfed by the more highly doped substrate layers.

The dual-resistivity substrate of the last example provided a good trade-off between substrate resistance and cross-talk at 10 GHz. At lower frequencies, the tradeoffs become easier. The lower value of R allows for a thinner $S_U$, and therefore greater shielding from $S_L$. At frequencies much higher than 10 GHz, exotic devices such as an embedded ground plane or a very thin substrate on metal will be necessary to provide any significant shielding from cross-talk.

Having thus described preferred embodiments of the invention and provided a disclosure for balancing resistive losses v. crosstalk losses, those skilled in the art will appreciate that further changes, modifications, additions and alterations may be made to the preferred embodiments without departing from the spirit and scope of the appended claims.

What we claim:

1. A bonded wafer with a semi-insulating layer for reducing losses and crosstalk at high frequencies comprising:
   a handle substrate having a noninsulating upper surface;
   a planar semi-insulating layer on the noninsulating upper surface of the handle wafer for reducing losses and crosstalk at high frequencies;
   a planar insulating layer on the planar semi-insulating layer; and
   a device layer of monocrystalline silicon on the insulating layer.

2. The bonded wafer of claim 1 wherein the handle wafer is doped and has a resistivity in the range of 1–10,000 ohm-cm.

3. The bonded wafer of claim 1 wherein the handle wafer has a resistivity of under one ohm-cm.

4. The bonded wafer of claim 1 wherein the semi-insulating layer comprises a member selected from the group consisting of diamond, silicon carbide and gallium arsenide.

5. The bonded wafer of claim 1 wherein the semi-insulating layer comprises one of the group consisting of polycrystalline silicon, amorphous silicon, SIPOS, and FIPOS.

6. The bonded wafer of claim 1 wherein the insulating layer is silicon dioxide.

7. The bonded wafer of claim 1 wherein the semi-insulating layer is thick enough to reduce substrate losses for frequencies above 1 GHz.

8. The bonded wafer of claim 1 wherein the semi-insulating layer is thin enough to reduce cross-talk between circuit elements for frequencies above 1 GHz.

9. The bonded wafer of claim 1 further comprising a thermal and electrical conductive barrier layer between the handle wafer and the semi-insulating layer.

10. The bonded wafer of claim 9 wherein the barrier layer comprises a silicided epitaxial layer.

11. The bonded wafer of claim 9 wherein the barrier layer includes a metal layer.

12. The bonded wafer of claim 1 wherein the semi-insulating layer is thicker than the insulating layer.

13. The bonded wafer of claim 1 wherein the semi-insulating layer is less than 6 times as wide as the smallest device.

14. The bonded wafer of claim 1 wherein the device layer comprises a plurality of devices and the semi-insulating layer is thicker than the insulating layer but less than 6 times as wide as the smallest device in the device layer.

15. The bonded wafer of claim 1 wherein the device wafer comprises monocrystalline silicon.

16. The bonded wafer of claim 1 wherein the semi-insulating layer comprises polycrystaline silicon.

17. The bonded wafer of claim 1 wherein the semi-insulating layer is thick enough to reduce resistivity losses but not so thick as to adversely affect crosstalk by reducing shielding.

18. A bonded wafer structure with a semi-insulating layer for reducing losses and crosstalk at high frequencies comprising:
- a handle substrate of monocrystalline silicon having a noninsulating upper surface;
- a semi-insulating layer of polysilicon on the noninsulating upper surface of the handle wafer;
- an insulating layer of silicon dioxide on the semi-insulating layer; and
- a device layer of monocrystalline silicon on the insulating layer.

19. The bonded wafer structure of claim 18 further comprising an epitaxial layer of silicon disposed on the surface of the handle substrate and between the handle wafer and the semi-insulating layer of polysilicon.

20. A substrate for carrying high frequency signals comprising:
- a device layer of monocrystalline semiconductor material including integrated devices forming an integrated circuit, said devices being spaced from each other a first distance;
- an planar upper substrate having a first resistivity for supporting the device layer and a controlled upper substrate thickness for controlling resistance losses due to high frequency signals at or above at least 1 GHz;
- a planar lower substrate having a noninsulating upper surface and a second resistivity for supporting the upper substrate and for suppressing crosstalk between devices in said device layer in inverse proportion to the distance between the device layer and the lower substrate;
- wherein the first resistivity is greater than the second resistivity and the thickness of the upper substrate is about the same or less than the width of the smallest active circuit devices and the device layer is on an upper surface of the upper substrate and the upper substrate is on the upper surface of the lower substrate.

21. The bonded wafer of claim 20 wherein the first resistivity is at least ten times as high as the second resistivity.

22. A bonded wafer structure with a semi-insulating layer for reducing losses and crosstalk at frequencies above 1 GHz comprising:
- a first layer of monocrystalline silicon;
- a barrier layer on the first layer of monocrystalline silicon;
- a semi-insulating layer of polysilicon on the barrier layer;
- an insulating layer of silicon dioxide on the semi-insulating layer; and
- a device layer of monocrystalline silicon on the semi-insulating layer.

23. The bonded wafer structure 22 wherein the barrier layer comprises a layer of silicided epitaxial monocrystalline silicon.

24. The bonded wafer of claim 23 wherein the barrier layer is metal.

* * * * *